United States Patent [19]
Blom

[11] Patent Number: 5,995,815
[45] Date of Patent: Nov. 30, 1999

[54] MULTIPLE BAND RECEIVER

[75] Inventor: Tomas Blom, Sollentuna, Sweden

[73] Assignee: Telefonaktiebolaget LM Ericsson, Stockholm, Sweden

[21] Appl. No.: 08/942,391

[22] Filed: Oct. 10, 1997

[30] Foreign Application Priority Data

Oct. 11, 1996 [SE] Sweden .................................. 9603730

[51] Int. Cl.⁶ .................................................. H04B 1/18
[52] U.S. Cl. .................................... 455/189.1; 455/180.1; 455/557; 455/143
[58] Field of Search .............................. 455/84, 86, 142, 455/143, 180.1, 189.1, 190.1, 188.1, 188.2, 314, 552, 557

[56] References Cited

U.S. PATENT DOCUMENTS

| | | | |
|---|---|---|---|
| 4,259,644 | 3/1981 | Iimura | 331/25 |
| 4,972,455 | 11/1990 | Phillips et al. | 379/59 |
| 5,422,931 | 6/1995 | Austin-Lazarus | 455/553 |
| 5,457,734 | 10/1995 | Eryaman et al. | 379/58 |
| 5,564,076 | 10/1996 | Auvray | 455/314 |
| 5,732,330 | 3/1998 | Anderson et al. | 455/84 |
| 5,835,853 | 11/1998 | Enoki et al. | 455/180.1 |

FOREIGN PATENT DOCUMENTS

| | | | |
|---|---|---|---|
| 0 541 305 | 5/1993 | European Pat. Off. | H03D 7/16 |
| 0 631 400 | 12/1994 | European Pat. Off. | H04B 7/26 |
| 0 678 974 | 10/1995 | European Pat. Off. | H03D 7/16 |
| 0 718 964 | 6/1996 | European Pat. Off. | H03D 7/16 |

OTHER PUBLICATIONS

PCT International–Type Search Report re: SE96/01100 completed Jul. 25, 1997.

*Primary Examiner*—Paul Loomis
*Attorney, Agent, or Firm*—Burns, Doane, Swecker & Mathis, L.L.P.

[57] ABSTRACT

The present invention relates to a multiple band receiver comprised in a mobile terminal. The receiver is able to receive radio signals in an upper frequency band ($FB_U$) and a lower frequency band ($FB_L$). The multiple band receiver comprises an antenna (ANT), a converting receiver part (R1), a heterodyne receiver part (R2) and a voltage controlled oscillator (VCO). The voltage controlled oscillator generates local oscillator frequencies ($f_{LO}$) substantially equal to the frequency shift between the two frequency bands. Radio signals ($f_{RF}$) in the upper frequency band ($FB_U$) are converted in the converting receiver part (R1) to substantially the lower frequency band ($FB_L$) by mixing with a local oscillator frequency ($f_{LO}$). The converted signal is mixed in the heterodyne receiver part (R2) with the same local oscillator frequency ($f_{LO}$) thus generating the same first intermediate frequency ($f_{IF1}$) as for signals in the upper frequency band.

26 Claims, 6 Drawing Sheets

| SYSTEM | $FB_U$ | $FB_L$ | $f_{LO}$ for $FB_U$ | $FB_L*$ | $f_{LO}$ för $FB_L$ | $f_{IF1}$ |
|---|---|---|---|---|---|---|
| GSM/ DCS1800 | 1805– 1880 MHz | 935– 960 MHz | 867– 904,5 MHz | 938– 975,5 MHz | 864– 889 MHz | 71 MHz |
| GSM/ PCS1900 | 1930– 1990 MHz | 935– 960 MHz | 1000,5– 1030,5 MHz | 929,5– 959,5 MHz | 1006– 1031 MHz | 71 MHz |
| AMPS/ AMPS1900 | 1930– 1990 MHz | 869– 894 MHz | 1059– 1089 MHz | 871– 901 MHz | 1057– 1082 MHz | 188 MHz |

Fig.4

MULTIPLE BAND RECEIVER

TECHNICAL FIELD

The present invention relates to a multiple band receiver for receiving radio signals in at least two separate frequency bands. More specifically the invention relates to a multiple band receiver comprised in a mobile communication unit using only one oscillator to generate a first intermediate frequency common to the different frequency bands.

STATE OF THE ART

A radio communication system usually operates in a frequency band specific to the system. As examples, the GSM system, the DCS1800 system, the PCS1900 system the AMPS system and the AMPS1900 system may be mentioned. The downlink frequency bands for these radio communication systems are 935–960 MHz, 1805–1880 MHz, 1930–1990 MHz, 869–894 MHz, and 1930–1990 MHz, respectively.

A receiver that can be used for receiving radio signals or radio frequencies in one of the above mentioned radio communication systems, is the heterodyne receiver. A heterodyne receiver mixes the received radio signal down to a lower so called intermediate frequency before the signal is demodulated to the desired base band signal.

The reception takes place in the following way: the received radio signal first passes through a band pass filter, and is then amplified. Then a first intermediate frequency is generated by a mixer. The mixer mixes the radio signal with a local oscillator frequency, in the following called an LO frequency. The LO frequency is generated by an oscillator, for example, a voltage controlled oscillator, usually in combination with a synthesizer and a reference crystal. When mixing the LO frequency and the filtered and amplified signal, in a heterodyne receiver, the difference frequency between the two frequencies may be selected. A further mixing to a second intermediate frequency may be carried out before the final demodulation of the signal to the desired base band signal takes place.

It is becoming increasingly common that there is more than one radio communication system in service within a geographical area. The different radio communication systems then operate in completely separate frequency bands. It would then be desirable for a receiver in a mobile terminal to be able to receive signals from more than one frequency band.

It is also desirable for a mobile terminal moving from a geographical area covered by a first radio communication system to a geographical area covered by a second radio communication system utilizing a different frequency band from the first system to be able to receive signals in both frequency bands.

One way of designing a multiple band receiver that is able to receive radio signals from two different frequency bands is to use two separate single band receivers. One of the receivers receives radio signals in the lower frequency band of the two frequency bands and the other receiver receives radio signals in the upper frequency band. A switching device connects each respective receiver to an antenna depending on the frequency band received.

A disadvantage of the device described above is that such a multiple band receiver requires much space in a mobile telephone. Another disadvantage is that such a multiple band receiver becomes expensive to manufacture, as all components must be duplicated.

Another way of designing a multiple band receiver is described in the published European patent application EP 0678974. Certain parts of a heterodyne receiver are here reused for reception in two different frequency bands. The disclosed double band receiver utilizes two different oscillators that have one common synthesizer. One of the oscillators is used to generate a first intermediate frequency for the upper frequency band and the other to generate the same first intermediate frequency for the lower frequency band. This implies that the two LO frequencies generated from the respective oscillator must be selected so that the frequency after the first mixer, that is, the first intermediate frequency, assumes the same value for both frequency bands. As the same first intermediate frequency is generated for the different frequency bands, the continued processing of the signals until a baseband signal has been obtained will be the same, independently of the received frequency band.

In the patent specification U.S. Pat. No. 4,972,455 and in the published patent application EP 0541305 a multiple band receiver that can switch between receiving frequencies from two different frequency bands is disclosed. An oscillator is used to generate a First intermediate frequency. The first intermediate frequency differs for the different frequency bands, and thus different filters are used for the different intermediate frequencies in the intermediate frequency section of the receiver.

One disadvantage of these receivers is that it is necessary to change between different filters in the receiver depending on the frequency band being received.

In the patent specification U.S. Pat. No. 5,457,734 a radio communication system is disclosed, the base stations of which are able to serve two different groups of mobile terminals operating in two separate frequency bands. A frequency converter converts downlink signals from the first subscriber group to the frequency band of the second subscriber group. Uplink signals from the second subscriber group are converted to the frequency band of the first subscriber group.

In the published patent application EP 0631400 a homodyne multiple band transceiver is disclosed, the receiving part of which can receive signals from two separate frequency bands, both from a satellite system and from a land based mobile system. A signal in the lower frequency band of the two bands is handled in the same way as in a common homodyne receiver, that is, it is converted directly to the base band. This is achieved by mixing the signal with an LO frequency generated by a voltage controlled oscillator. The LO frequency is of the same order of magnitude as the frequency of the signal in the lower frequency band. A signal in the upper frequency band of the two frequency bands is converted to substantially the lower frequency band through mixing with a converting frequency. The converting frequency is generated by dividing the LO frequency from the voltage controlled oscillator by a suitable integer. The signal is then demodulated in the same way as a signal in the lower frequency band. The invention will now be described in more detail by means of preferred embodiments and with reference to the accompanying drawing.

SUMMARY OF THE INVENTION

The present invention attempts to solve the problem of how to design a multiple band receiver comprised in a mobile telephone in a simple and cost-effective way.

A further problem is how to design the multiple band receiver using as few components as possible, so that it becomes as compact as possible.

The problems are solved by designing a multiple band receiver in such a way that it only uses one oscillator to generate the same intermediate frequency for received radio signals in at least two different frequency bands. Radio signals from a first frequency band are converted substantially to a second frequency band, before the same oscillator is used by both frequency bands to generate a first intermediate frequency for frequencies in the second frequency band and/or for frequencies substantially in the second frequency band.

More specifically, the problems are solved by designing a multiple band receiver comprising at least one converting receiver part and a heterodyne receiver part. The heterodyne receiver part and the converting receiver part utilize LO frequencies generated by the same oscillator.

Radio signals in a first frequency band are received by an antenna connected to the converting receiver part. Through mixing with an LO frequency from the oscillator a received radio signal is converted to a second frequency band when the frequency bands are of the same size, or substantially to the frequency range of the second frequency band when the frequency bands have different bandwidths. The converting receiver part is connected to the heterodyne receiver part. The converted radio signal is mixed in the heterodyne receiver part, to a first intermediate frequency. In the mixing, the converted frequency is mixed with the same LO frequency that was used in the mixing in the converting receiver part.

When frequencies in the second frequency band are received by the antenna, the converting receiver part is bypassed, whereby the antenna is connected to the heterodyne receiver part. A received radio signal is mixed by the heterodyne receiver part with an LO frequency, generated by the oscillator, to the same first intermediate frequency generated for received radio signals in the second frequency band. Switching devices are arranged for the connection of the antenna to one of the receiving parts and for the connection of the receiving parts to each other, depending on the frequency band of the received radio signal. The LO frequencies generated by the oscillator are equal to or approximately equal to the frequency spacing between the frequency bands.

The invention will now be described in more detail by means of preferred embodiments and with reference to the accompanying drawings.

BRIEF DESCRIPTION OF THE DRAWINGS

FIG. 4 is a table of values of LO frequencies and intermediate frequencies for different combinations of radio communication systems.

PREFERRED EMBODIMENTS

Figure 1:
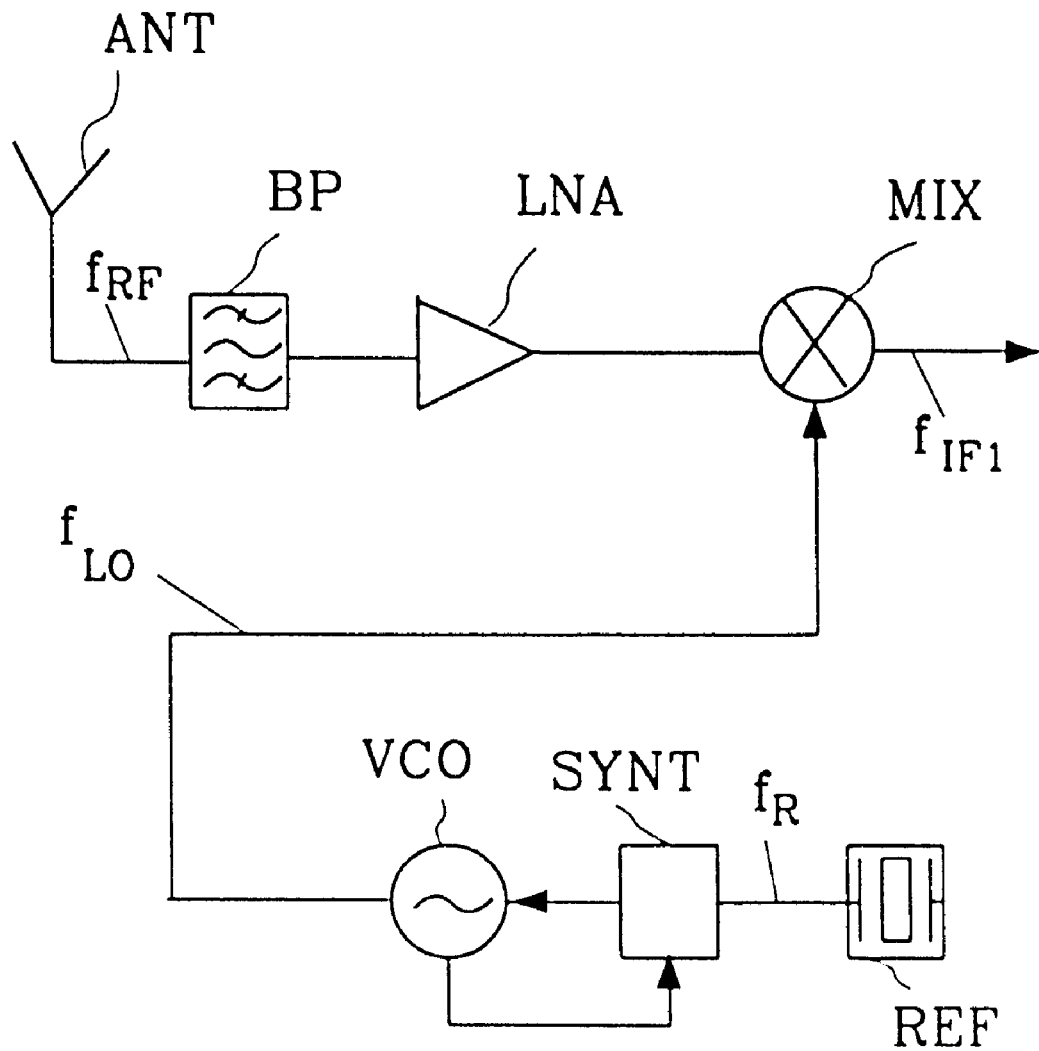
FIG. 1 is a schematic block diagram of a heterodyne single band receiver known in the art.

FIG. 1 shows a schematic block diagram of a part of a prior art heterodyne single band receiver. A radio signal, or a radio frequency $f_{RF}$, is received by an antenna ANT and then passes a bandpass filter BP adapted to the frequency band in question. The filtered signal is amplified by an amplifier, for example a low noise amplifier LNA, to reduce the noise level. The amplified signal is then mixed with a local oscillator frequency or, with a shorter expression, an LO frequency $f_{LO}$ generated by an oscillator VCO, which may be, for example, a voltage controlled oscillator. The LO frequency is generated in a way common in the art by the oscillator VCO, by means of a reference frequency $f_R$ from a reference crystal REF and a synthesizer SYNT. The synthesizer and the oscillator are interconnected in a phase locked loop in a way common in the art, which is indicated in the figure by an arrow from the synthesizer to the oscillator and an arrow from the oscillator to the synthesizer. In the mixing, the frequency spacing $f_{RF}-f_{LO}$ (in the case when $f_{RF}>f_{LO}$) between the LO frequency and the radio signal may be utilized, to obtain a first intermediate frequency $f_{IF1}$.

The first intermediate frequency $f_{IF1}$ can in turn be mixed down further to a second intermediate frequency before the final demodulation to a desired base band signal takes place. The reference frequency from the reference crystal may for example be multiplied by a factor and used by a further mixer generating the second intermediate frequency. This is, however, not shown in the figure.

A so called image frequency $f_{image}$ may cause interference with the intermediate frequency after the mixer, as is known in the art. The image frequency is the frequency that equals the difference between the LO frequency and the intermediate frequency $f_{IF}$, that is: $f_{image}=f_{LO}-f_{IF}$ (in the case when the LO frequency is higher than the intermediate frequency). If the image frequency is not within the bandwidth of the frequency band in question it has already been eliminated by the bandpass filter BP before the mixer MIX. If that is not the case the image frequency $f_{image}$ must be removed before the mixer MIX. This may be done in a way common in the art, either by arranging a special image rejection filter before the mixer and/or by using as a mixer a so called image rejection mixer.

Below different embodiments of a multiple band receiver according to the invention are described. In all cases it is assumed that image rejection mixers or image rejection filters are used in the cases when the image frequency has to be eliminated.

Figure 2:
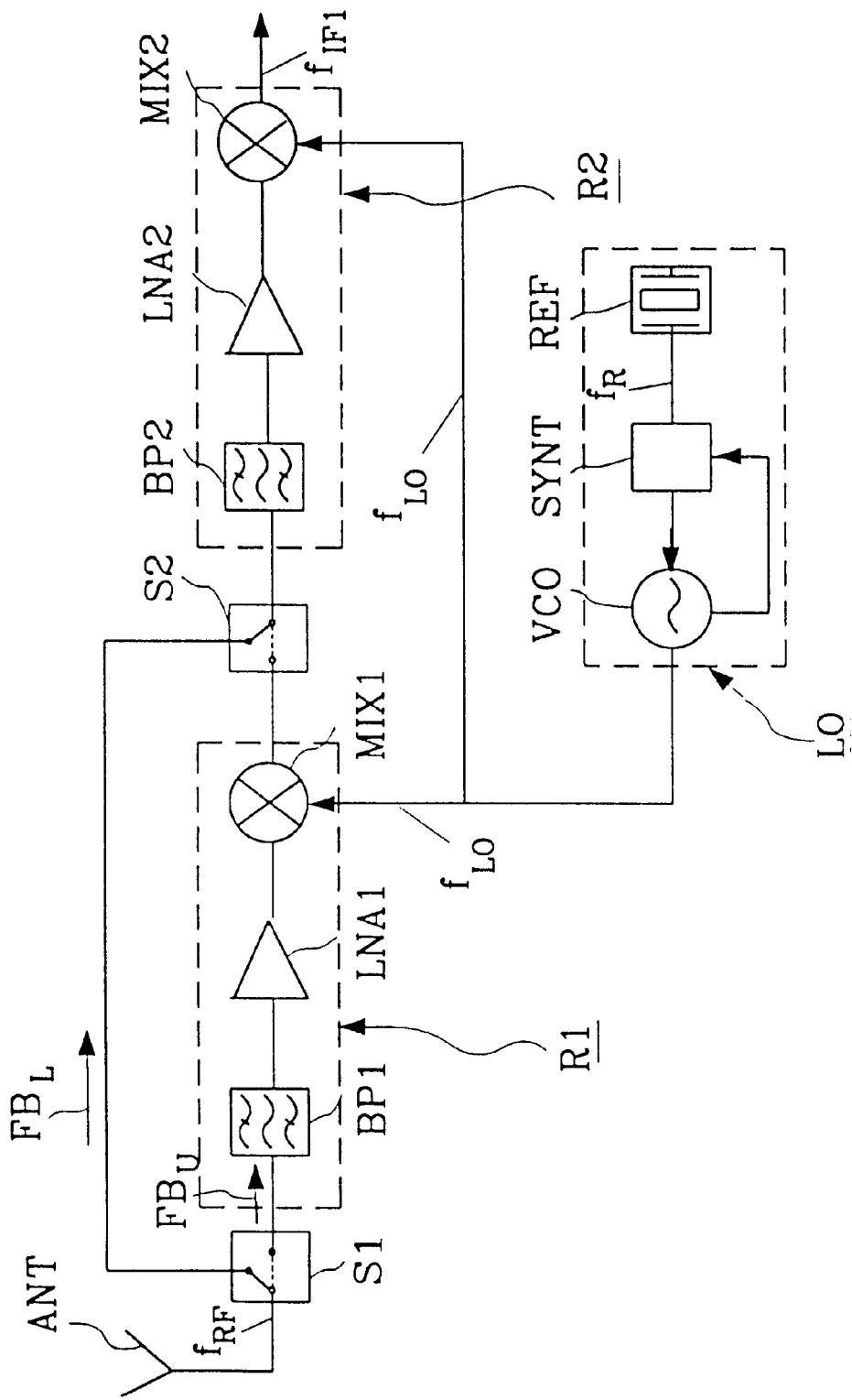
FIG. 2 is a schematic block diagram of a first embodiment of a multiple band receiver for receiving signals from two separate frequency bands according to the invention.

FIG. 2 shows a schematic block diagram of a first inventive embodiment of a multiple band receiver that can receive signals from two separate frequency bands. The receiver comprises an antenna ANT, a heterodyne receiver part R2, a converting receiver part R1 and a device LO for generating LO frequencies. The converting receiver part R1 converts signals from an upper frequency band $FB_U$ of the two frequency bands to a lower frequency band $FB_L$ or substantially to the lower frequency band, as will be explained in more detail below.

The heterodyne receiver part R2 mixes down a signal from the lower frequency band FBL or from the area around the lower frequency band to a first intermediate frequency fIF1. The device LO for generation of LO frequencies comprises an oscillator VCO, in the present case a voltage controlled oscillator, a synthesizer SYNT and a reference crystal REF, each operating in the same way as described above in connection with FIG. 1.

In the following a first embodiment of the invention will be described, in which the two frequency bands are assumed to have the same frequency range. The antenna ANT receives a high frequency radio signal $f_{RF}$ in the upper frequency band $FB_U$ of the two frequency bands or from the lower frequency band $FB_L$. The reception in the respective frequency band takes place at different times.

If it is assumed that a radio signal $f_{RF}$ received by the antenna ANT is in the upper frequency band $FB_U$, the antenna ANT is connected through a first switch S1 to the converting receiver part R1 which is in turn connected through a second switch S2 to the heterodyne receiver part R2. If a received radio signal instead lies in the lower of the two frequency bands $FB_L$ the converting receiver part R1 is bypassed. The antenna ANT is then connected through the first switch S1 directly to the heterodyne receiver part R2. A radio signal in the upper frequency band will thus first pass the converting receiver part, in which it is converted to a signal in the lower frequency band. The signal processing then continues in the heterodyne receiver part in the same way as for a received radio signal in the lower frequency band. The switches may, as is well known in the art, comprise combinations of PIN diodes and so called strip lines.

It is also possible to design the multiple band receiver with only a first switch S1, in which case the converting receiver part is constantly connected to the heterodyne receiver part. In FIG. 2 the switches are shown in the position that they assume when the received radio signal lies in the lower frequency band. The case when the radio signal is in the upper frequency bands is indicated in the figure as a dashed line in the switches.

Assuming first that a radio signal $f_{RF}$ lying in the upper frequency band $FB_U$ is received by the antenna ANT, the radio signal will pass through the first switch S1 to the converting receiver part R1. This is illustrated in FIG. 2 by an arrow from the first switch to the converting receiver part. The converting receiver part comprises a bandpass filter BP1 adapted to the upper frequency band $FB_U$, an amplifier LNA1, in the present case a low noise amplifier, and a mixer MIX1. In the mixer the filtered and amplified signal is mixed with an LO frequency $f_{LO}$. The LO frequency is generated in a way known in the art by the device LO for generation of LO frequencies.

According to the invention, radio signals in the upper frequency band $FB_U$ are to be converted, through mixing with an LO frequency, to signals in the lower frequency band $FB_L$. This implies that the LO frequency $f_{LO}$ must be equal to the frequency spacing between the two frequency bands.

The converted signal then passes the second switch S2 to the heterodyne receiver part R2. The heterodyne receiver part R2 comprises a bandpass filter BP2 adapted to the lower frequency band $FB_L$, an amplifier, for example a low noise amplifier LNA2 and a mixer MIX2

In the mixer MIX2 in the heterodyne receiver part R2 the converted signal is mixed with the same LO frequency used in the first mixer MIX1 in the converting receiver part R1. In this way a first intermediate frequency $f_{IF1}$ is obtained which may be the frequency spacing between the converted signal and the LO frequency $f_{LO}$.

If instead it is assumed that a radio signal $f_{RF}$ in the lower frequency band $FB_L$ is received by the antenna ANT, the converting receiver part R1 is bypassed. This means that the radio signal, via the first switch S1 and via the second switch S2, passes directly to the heterodyne receiver part R1. This is illustrated in FIG. 2 by an arrow from the first switch S1 to the second switch S2. The radio signal then passes the previously mentioned bandpass filter BP2 and the low noise amplifier LNA2 The incoming signal is then mixed in the second mixer MIX2 with an LO frequency $f_{LO}$ generated by the device LO for generating LO frequencies. The LO frequency is selected so that the same first intermediate frequency $f_{IF1}$ is obtained as for radio signals received in the upper frequency band $FB_U$.

The device LO for generating LO frequencies can generate LO frequencies within a frequency interval. The smaller this frequency interval is, the less disturbed the LO frequency will be. In order for a signal in the upper frequency band $FB_U$ to be converted to the lower frequency band $FB_L$, the device LO for generating LO frequencies must generate LO frequencies the same size as the frequency spacing between the upper and the lower frequency band.

A signal in the lower frequency band $FB_L$ thus passes the same components that are found in a heterodyne single band receiver. A signal in the upper frequency band first passes the converting receiver part R1 in which the received signal is converted to a signal in the lower frequency band $FB_L$. The converted signal then passes the same components in the heterodyne receiver part R2 as a signal in the lower frequency band. The LO frequencies are selected so that the same first intermediate frequency is generated for the signals in the upper and the lower frequency band.

Since different radio communication systems often utilize frequency bands of different bandwidth, the situation arises that one of the two received frequency bands is wider than the other. If the frequency bands have different bandwidths there is often not a fixed frequency spacing between the frequency bands. In the combinations of the previously mentioned radio communication systems, such as GSM/DCS1800, GSM/PCS1900, AMPS/AMPS1900, the upper frequency band of the two frequency bands is wider than the lower frequency band.

In the following the multiple band receiver is described according to the embodiment shown in FIG. 2, for the case when the upper frequency band is wider than the lower frequency band, as is the case for the above mentioned combinations of telecommunications systems.

A radio signal in the upper frequency band is received by the antenna ANT and is subjected to the same signal processing in the converting receiver part R1 as was described in the case of frequency bands of the same bandwidth. In the first mixer MIX1 in the converting receiver part R1, in the present case, the filtered and amplified signal is mixed with an LO frequency. As there is no fixed frequency spacing between the frequency bands, the generated LO frequency is approximately equal to or substantially equal to the frequency spacing between the two frequency bands The frequency spacing between the two bands may for example be represented by the frequency spacing between the middle frequencies in the respective frequency band. The signals in the upper frequency band $FB_U$ are then converted to a frequency range that can be wider of somewhat displaced in relation to the lower frequency band $FB_L$, depending on how big the bandwidth difference is between the frequency bands. The converted signals still end up substantially within the frequency area of the lower frequency and $FB_L$.

The converted signal passes through the second switch S2 to the heterodyne receiver part R2. Since the converted signal may lie in a frequency area somewhat wider than the lower frequency band, or displaced relative to it, the passband of the bandpass filter BP2 in the heterodyne receiver part in the present case must be correspondingly wider than the lower frequency band. The passband in the bandpass filter BP2 in the heterodyne receiver part R2 must then be at least as wide as the lower frequency band $FB_L$, but is in the present case wider.

Since the passband of the bandpass filter BP2 in the heterodyne receiver part R2 in the example above is somewhat wider than the lower frequency band, its edges should be very sharp. This may be a problem in certain applications, for example for GSM/PCS.

Figure 3:
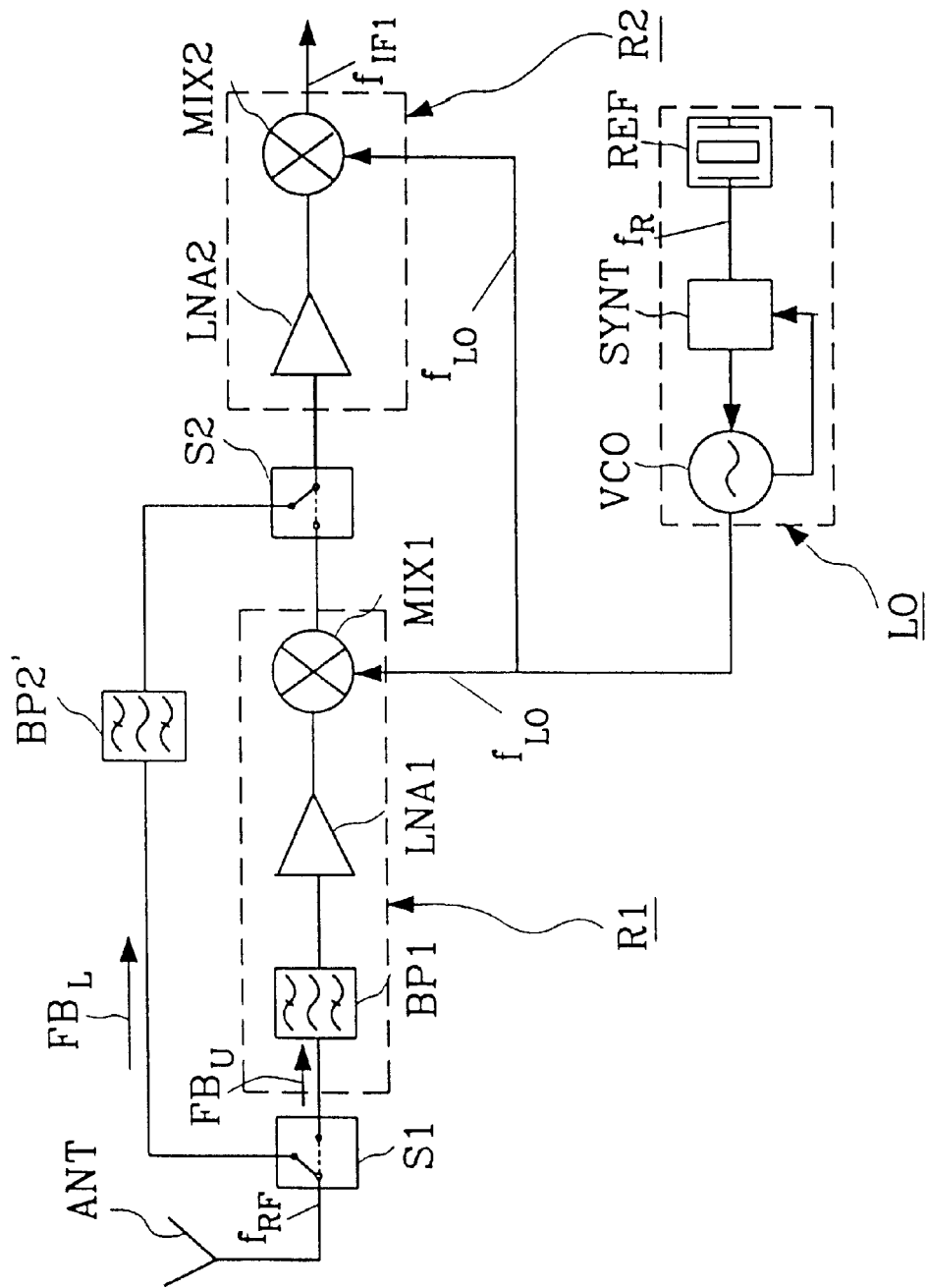
FIG. 3 is a schematic block diagram of a second embodiment of a multiple band receiver for receiving signals in two different frequency bands according to the invention.

FIG. 3 shows an alternative embodiment of a multiple band receiver that can receive signals from an upper and a lower frequency band, $FB_U$, $FB_L$, whereby the upper frequency band is assumed to be wider than the lower frequency band. The references used for the different components are the same as in FIG. 2. The bandpass filter BP2 in the heterodyne receiver part R2, according to FIG. 2, has been removed in the present example. Instead a bandpass filter BP2' has been arranged between the first and the second switch S1 and S2. The passband of this bandpass filter is adapted to the bandwidth of the lower frequency band $FB_L$ and thus its passband does not have to be as wide as that of the second bandpass filter BP2 in FIG. 2.

This solution implies high requirements on the bandpass filter BP1 and the mixer MIX1 in the converting receiver part R1, so that no undesired frequencies leak through the mixer MIX1 into the heterodyne receiver part R2. To prevent this, an additional bandpass filter, suppressing undesired frequencies, can be placed directly after the mixer MIX1 in the converting receiver part. This is, however, not shown in the figure.

The table in FIG. 4 shows a compilation of some different combinations of radio communications systems, GSM/(DCS1800, GSM/PCS1900 and AMPS/AMPS1900, which use two separate frequency bands. The upper frequency band is in all cases wider than the lower. The table shows the upper and the lower frequency bands $FB_U$ and $FB_L$, examples of LO frequencies $f_{LO}$ for the respective frequency band $FB_U$ and $FB_L$, and the converting frequency band $FB_{L*}$ to which signals in the upper frequency band are converted. The intermediate frequencies $f_{IF1}$ obtained in this way are shown in the right column.

An example according to the table for the combination GSM/DCS1800 will be explained in more detail. The upper frequency band $FB_U$ is in the present example the downlink band of the DCS1800 system and the bandwidth is 1805–1880 MHz. The lower frequency band is the downlink band of the GSM system and the bandwidth is 935–960 MHz. Assuming that the lowest frequency of the upper frequency band $FB_U$, 1805 MHz, is received and the desired intermediate frequency $f_{IF1}$ after the two mixings in the mixers MIX1 and MIX2 is 71 MHz, the LO frequency $f_{LO}$ will be 867 MHz. The received frequency will then fist be mixed with the LO frequency and converted to 938 MHz before it is mixed down with the same LO frequency to the first intermediate frequency.

Assuming that the lowest frequency in the lower frequency band $FB_L$, 935 MHz, is received and the same intermediate frequency $f_{IF1}$ of 71 MHz is to be obtained, the LO frequency must be 864 MHz.

Assuming that the highest frequency of the upper frequency band $FB_U$, 1880 MHz, is received, the LO frequency $f_{LO}$ must be 904.5 MHz, whereby the converting frequency is 975.5 MHz. The converting frequency then lies just outside of the lower frequency band, which ends at 960 MHz.

The frequency spacing between the lowest frequencies of the two frequency band is 870 MHz and the frequency spacing between the highest frequencies of the frequency bands is 920 MHz. The intervals of the LO frequencies for the upper frequency band lie in the interval 867–904.5 MHz and the LO frequencies for the lower frequency band lie in the interval 864–889 MHz. Thus, the LO frequencies are approximately equal to the difference in frequency between the two frequency bands. Signals in the upper frequency band are converted to the converted frequency range $FB_{L*}$, 938–975.5 MHz, and the lower frequency band $FB_L$ is 935–960 MHz, so that the converting frequency band does not lie entirely within the lower frequency band, but substantially in the frequency range of the lower frequency band.

Figure 5:
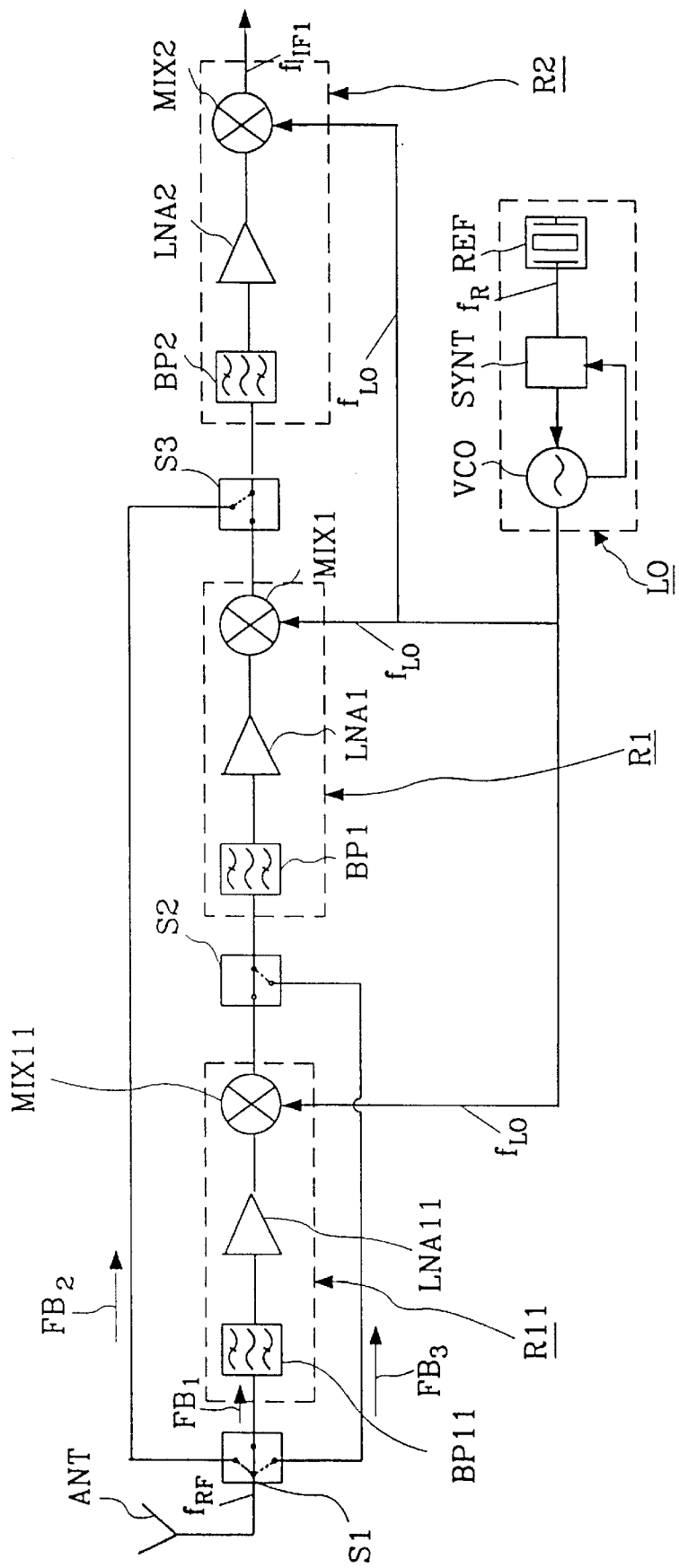
FIG. 5 is a schematic block diagram of a third embodiment of a multiple band receiver for receiving signals from three different frequency bands according to the invention.

FIG. 5 shows an alternative embodiment of the invention in which the multiple band receiver is able to receive signals in a first, a second and a third frequency band $FB_1$, $FB_2$ and $FB_3$. The third frequency band lies between the first and the second frequency bands and is therefore called the intermediate band. The first frequency band $FB_1$ is in the present case the upper of the three bands and the second frequency band $FB_2$ is the lower of the bands. It is assumed that the frequency spacing between the first frequency band and the intermediate band is as great or substantially as great as the frequency spacing between the intermediate band and the second frequency band.

The multiple band receiver in the present case comprises an antenna, a first converting receiver part R11, a second converting receiver part R1 and a heterodyne receiver part R2, and a device LO for generating LO frequencies, said device being used by all three receiver parts.

The second converting receiver part R1 and the heterodyne receiver part R2 correspond to the double band receiver described in connection with FIG. 2. The references used for the components in the second converting part R1 and the heterodyne part R2 are the same as in FIG. 2. That is, to the double band receiver an additional converting receiver part R11 has been added.

If the frequency bands have the same width, as described in connection with FIG. 2, the first frequency band $FB_1$ is converted in the first converting receiver part R11 to the intermediate band $FB_3$. If that is not the case the first frequency band is converted to substantially the frequency range of the intermediate band. The continued signal processing in the second converting receiver part R1 and the heterodyne receiver part R2 thereafter are the same as described in connection with FIG. 2.

The antenna ANT is connected via a first switch S1 to either the first converting receiver part R11 or the second converting receiver part R1 or the heterodyne receiver part R2. The first converting receiver part R11 is connected to the second converting receiver part via a second switch S2. The second converting receiver part is connected to the third converting receiver part R2 via a third switch S3. In FIG. 5 the switches are shown in the position for reception of signals from the first frequency band. Each respective receiver part comprises a bandpass filter BP11, BP1, BP2, a low noise amplifier LNA11, LNA1, LNA2 and a mixer MIX11, MIX1, MIX2. Each respective mixer is connected to the device LO for generating LO frequencies.

Assuming that a radio channel $f_{RF}$ in the first frequency band $FB_1$ is received by the antenna ANT, the antenna is connected via the first switch S1 to the first converting receiver part R11. This is illustrated in FIG. 5 by an arrow from the first switch S1 to the first converting receiver part R11. The radio signal then passes a bandpass filter BP11 for the first frequency range $FB_1$, a low noise amplifier LNA11 and a mixer MIX11. In the mixer, the signal is mixed with an LO frequency $f_{LO}$ generated by the oscillator VCO. The LO frequency is equal to the frequency spacing between the First frequency band $FB_1$ and the intermediate band $FB_3$, or the intermediate band $FB_3$ and the second frequency band $FB_2$, respectively, or if the frequency bands have different widths, approximately to these frequency spacings. In this way the signal in the first frequency band $FB_1$ is converted to, or substantially to, the intermediate band $FB_3$.

The converted signal then passes via the second switch S2 to the second converting receiver part R1. This part comprises a bandpass filter BP1, a low noise amplifier LNA1 and a mixer MIX1. The mixer mixes the converted signal with the same LO frequency that was used in the first converting receiver part R11, whereby a second converted signal is obtained. The second converted signal will be within or substantially within the second frequency band $FB_2$.

The second converted signal then passes, via the third switch S3, to the heterodyne receiver part R2. The second converted signal passes a bandpass filter BP2, a low noise amplifier LNA2 and another mixer MIX2. The second converted signal is mixed with the same LO frequency as before, whereby a first intermediate frequency $f_{IF1}$ is generated.

Assuming, instead, that a radio signal $f_{RF}$ in the intermediate band $FB_3$ is received, the first converting receiver part R11 is bypassed. The antenna ANT is then connected directly to the second converting receiver part R1 via the first switch S1 and the second switch S2. This is illustrated in FIG. 5 by an arrow from the first switch S1 to the second switch S2. The received signal is converted to the second frequency band $FB_2$ or substantially to this frequency band. The signal is then converted by the heterodyne receiver part R1 to the same first intermediate frequency $f_{IF1}$ as above.

Assuming instead that a radio signal $f_{RF}$ in the second frequency band FB2 is received by the multiple band receiver, both converting receiver parts R11, R1 are bypassed. The antenna ANT is then connected via the first switch S1 and via the third switch S3 directly to the heterodyne receiver part R2. This is illustrated in FIG. 5 by an arrow from the first switch S1 to the third switch S3. The signal is then converted to the same first intermediate frequency $f_{IF1}$ as above after first having been bandpass filtered and amplified.

In accordance with the embodiment shown in FIG. 3, the bandpass filter BP2 in the heterodyne receiver part R2 may instead be located before the heterodyne receiver part, between the first and the third switch S1, S3. In the same way the bandpass filter BP1 in the second converting receiver part R1 may be placed before the converting receiver part, between the first and the second switch S1, S2.

Figure 6:
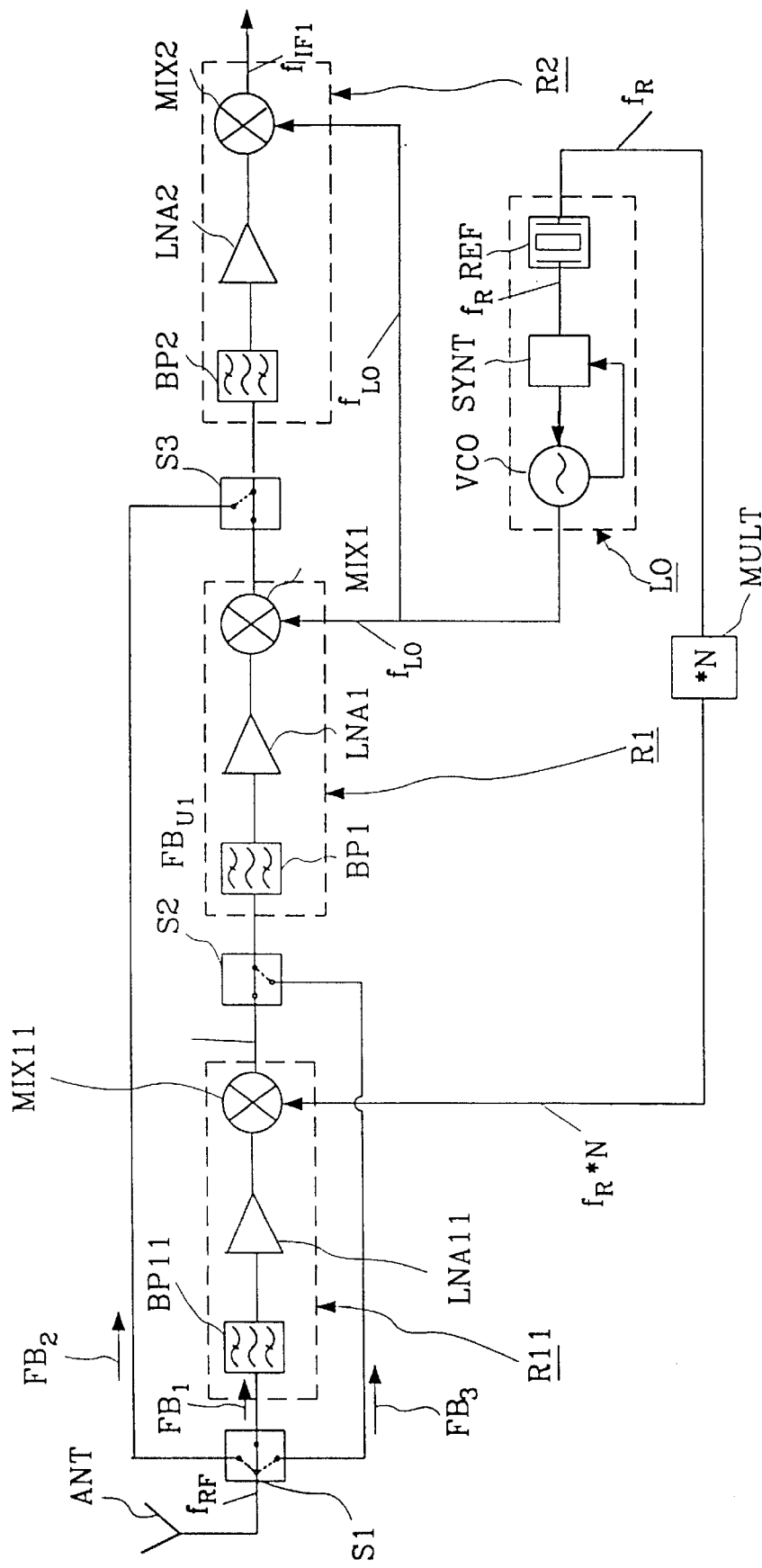
FIG. 6 is a schematic block diagram of a fourth embodiment of a multiple band receiver for receiving signals in three different frequency bands according to the invention.

FIG. 6 shows yet another embodiment of the invention in which three separate frequency bands are being received. In the present case the spacing between the first frequency band and the intermediate band is substantially less than the spacing between the intermediate band and the second frequency band. As an illustrative example, the combination of GSM, DCS1800/PCS1900 may be considered. The frequency spacing between the upper, or first, frequency band (PCS1900: 1930–1990 MHz) and the intermediate frequency band (DCS1800: 1805–1880 MHz) is approximately 120 MHz. The spacing between the intermediate band and the lower, or second, frequency band (GSM: 935–960 MHz) is approximately 900 MHz.

In this case as well, the receiver comprises an antenna ANT, a first R11 and a second R1 converting receiver part, a heterodyne receiver part R2 and a device LO for generating LO frequencies.

The same references as in FIG. 5 have been used in FIG. 6. The second converting receiver part R1 converts signals in a frequency range at least covering the intermediate band $FB_3$, to substantially the second frequency band $FB_2$. The heterodyne receiver part R2 generates a first intermediate frequency $f_{IF1}$ by mixing a signal within a frequency range at least covering the second frequency band $FB_2$ with an LO frequency $f_{LO}$ generated in the same way as described above.

The first converting receiver part R11 converts a radio signal in the first frequency band $FB_1$ to substantially the frequency range of the intermediate band $FB_3$. This is done in the same way as before, by mixing the signal with an LO frequency, said LO frequency being substantially equal to the frequency spacing between the first frequency band and the intermediate band. The LO frequency in the present case cannot assume the same value as the LO frequency used by the second converting receiver part R1 and the heterodyne receiver part R2. The reference frequency $f_R$ generated in the reference crystal REF can in the present case be multiplied in a multiplier MULT by a factor N to a suitable LO frequency and used in the first converting receiver part R11.

In all the embodiments described above the lower frequency band has been processed in the heterodyne receiver part. The upper frequency bands have been converted to substantially the lower frequency band.

It is of course possible instead to convert signals in the lower frequency band to the upper frequency band and let the upper frequency band be received by the heterodyne receiver part. In such cases the sum frequency of an LO frequency and the received signal be selected at conversion of a signal in the lower frequency band to a signal in the upper frequency band. This implies, however, that radio signals in the lower frequency band are converted to the upper frequency band, thus generating an intermediate frequency. This may be less desirable if the object of generating an intermediate frequency is to convert the received radio signal down to a lower frequency.

Also, it is clearly seen that the LO frequencies generated by the device for generation of LO frequencies may also be used by a transmitter part in a combined transmitter/receiver in transmit mode. It is then possible to have either a directly modulated oscillator or a transmitter-mixer.

I claim:

1. A multiple band receiver for receiving radio signals from a first frequency band, a second frequency band, and a third frequency band which lies between the first and second frequency bands, the multiple band receiver comprising:

a first down conversion means for converting the received radio signals from said first frequency band to a third signal substantially within the third frequency band;

a second down conversion means for converting the received radio signals from said third frequency band to a second signal substantially within the second frequency band or for down converting the third signal to a fourth signal substantially within the second frequency band;

a third down conversion means for converting the received radio signals from said second frequency band to an intermediate frequency or for down converting the second signal or the fourth signal to the intermediate frequency;

wherein said first, second and third down conversion means all use a single oscillator for down conversion.

2. The multiple band receiver of claim 1, wherein said first, second and third down conversion means comprise:
   a filter for filtering an incoming signal;
   an amplifier for amplifying the filtered incoming signal; and
   a mixer for mixing the amplified, filtered incoming signal with a signal from said single oscillator to produce a down converted signal.

3. The multiple band receiver of claim 1, wherein a frequency spacing between said first frequency band and said third frequency band is substantially equal to a frequency spacing between the third frequency band and the second frequency band.

4. The multiple band receiver of claim 3, wherein single oscillator generates frequencies that are equal to the difference of the frequency spacing between the first and third frequency bands.

5. The multiple band receiver of claim 1, wherein a frequency spacing between the first frequency band and the third frequency band is substantially less than a frequency spacing between the third frequency band and the second frequency band.

6. The multiple band receiver of claim 5, wherein said single oscillator outputs a signal with a frequency equal to the frequency spacing between the first frequency band and the third frequency band, and a reference crystal connected to said single oscillator supplies a frequency signal to said first down converting means.

7. The multiple band receiver of claim 1, further comprising:
   a first switch connected between a receiving antenna and said first down converting means;
   a second switch connected between said first down converting means and said second down converting means; and
   a third switch connected between said second down converting means and said third down converting means.

8. The multiple band receiver of claim 7 wherein, if said received radio signals are within said first frequency band, said first switch connects the receiving antenna to an input of the first down converting means.

9. The multiple band receiver of claim 8, wherein the second switch connects an output of said first down converting means to an input of the second down converting means, and the third switch connects an output of the second down converting means to an input of the third down converting means.

10. The multiple band receiver of claim 7 wherein, if said received radio signals are within said second frequency band, said first switch connects the receiving antenna and the third switch, and the third switch connects said received radio signals to an input of the third down converting means.

11. The multiple band receiver of claim 10, wherein said third switch connects an output of the second down converting means to an input of the third down converting means.

12. The multiple band receiver of claim 7, if said received radio signals are within said third frequency band, said first switch connects the receiving antenna to the second switch and the second switch connects said received radio signals to an input of the second down converting means.

13. The multiple band receiver of claim 1, wherein said single oscillator is a voltage controlled oscillator.

14. In a multiple band receiver a method for receiving radio signals from a first frequency band, a second frequency band, and a third frequency band which lies between the first and second frequency bands, the method comprising the steps of:
   down converting, in a first down conversion means, the received radio signals from said first frequency band to a third signal substantially within the third frequency band;
   down converting, in a second down conversion means, the received radio signals from said third frequency band to a second signal substantially within the second frequency band or for down converting the third signal to a fourth signal substantially within the second frequency band;
   down converting, in a third down conversion means, the received radio signals from said second frequency band to an intermediate frequency or for down converting the second signal or the fourth signal to the intermediate frequency;
   wherein said first, second and third down conversion means all use a single oscillator for down conversion.

15. The method of claim 14, wherein said steps of down converting in the first, second and third down conversion means further comprises the steps of:
   filtering an incoming signal;
   amplifying the filtered incoming signal; and
   mixing the amplified, filtered incoming signal with a signal from said single oscillator to produce a down converted signal.

16. The method of claim 14, wherein a frequency spacing between said first frequency band and said third frequency band is substantially equal to a frequency spacing between the third frequency band and the second frequency band.

17. The method of claim 16, further comprising the step of:
   generating, in the single oscillator, frequencies that are equal to the difference of the frequency spacing between the first and third frequency bands.

18. The method of claim 14, wherein a frequency spacing between the first frequency band and the third frequency band is substantially less than a frequency spacing between the third frequency band and the second frequency band.

19. The method of claim 14, further comprising the steps of:
   outputting, from said single oscillator, a signal with a frequency equal to the frequency spacing between the first frequency band and the third frequency band; and
   supplying, from a reference crystal connected to said single oscillator, a frequency signal to said first down converting means.

20. The method of claim 14, further comprising the steps of:
   switching, via a first switch, a signal received from an antenna to an input of said first down converting means, a second switch or a third switch;
   switching, via the second switch, an output signal from said first down converting means or said signal received from the antenna to an input of the second down converting means; and
   switching, via the third switch, a signal from an output of the second down converting means or said signal received from the antenna to an input of the third down converting means.

21. The method of claim 20 wherein, if said received radio signals are within said first frequency band, said first switch connects the receiving antenna to an input of the first down converting means.

22. The method of claim 21, wherein the second switch connects an output of said first down converting means to an input of the second down converting means, and the third switch connects an output of the second down converting means to an input of the third down converting means.

23. The method of claim 20 wherein, if said received radio signals are within said second frequency band, said first switch connects the receiving antenna to an input of the third switch, and the third switch connects said received radio signals to an input of the third down converting means.

24. The method of claim 23, wherein said third switch connects an output of the second down converting means to an input of the third down converting means.

25. The method of claim 20 wherein, if said received radio signals are within said third frequency band, said first switch connects the receiving antenna to the second switch, and the second switch connects said received radio signals to an input of the second down converting means.

26. A multiple band receiver for receiving radio signals from a first frequency band and a second frequency band, the multiple band receiver comprising:

an antenna for receiving radio signals in said first frequency band and said second frequency band;

means for generating local oscillator frequencies, wherein said means for generating local oscillator frequencies comprises only one oscillator;

converting receiver means for converting signals in the first frequency band to a frequency range substantially within the second frequency band, wherein said converting receiver part comprises a mixer for mixing signals in the first frequency band with local oscillator frequencies;

heterodyne receiver means comprising a mixer for mixing incoming signals with the local oscillator frequencies to generate a first intermediate frequency, wherein said heterodyne receiver means receives signals in a frequency range covering the second frequency band; and switching means for connection of the antenna to any of the converting receiver means and the heterodyne receiver means, and for connection of the converting receiver means to the heterodyne receiver means, in dependence of the frequency band in which the radio signals received by the antenna lie, whereby the same first intermediate frequency is generated for received radio signals from said first frequency band and from said second frequency band.

* * * * *